United States Patent
Jarman et al.

(10) Patent No.: US 7,498,965 B2
(45) Date of Patent: Mar. 3, 2009

(54) HIGH SPEED TRANSMISSION SYSTEM

(75) Inventors: David C. Jarman, Summerfield, NC (US); Luca Vassalli, Sata Clara, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/516,239

(22) Filed: Sep. 6, 2006

(65) Prior Publication Data

US 2007/0057835 A1    Mar. 15, 2007

Related U.S. Application Data

(60) Provisional application No. 60/717,312, filed on Sep. 15, 2005.

(51) Int. Cl.
    *H03M 1/12* (2006.01)
(52) U.S. Cl. .................. 341/155; 341/101
(58) Field of Classification Search ........... 341/155, 341/101, 100, 50, 60; 714/43, 700; 709/233
    See application file for complete search history.

(56) References Cited

U.S. PATENT DOCUMENTS

| | | | | |
|---|---|---|---|---|
| 4,030,129 A * | 6/1977 | Whitlock | ...................... | 360/32 |
| 4,190,898 A * | 2/1980 | Farnsworth et al. | ........... | 710/69 |
| 4,206,476 A * | 6/1980 | Hashimoto | .................. | 386/101 |
| 4,216,492 A * | 8/1980 | Schmalz | ........................ | 386/1 |
| 5,138,440 A | 8/1992 | Radice | | |
| 5,442,750 A * | 8/1995 | Harriman et al. | ............ | 709/233 |
| 5,793,318 A | 8/1998 | Jewett | | |
| 5,892,553 A * | 4/1999 | Delmas | ....................... | 348/578 |
| 6,480,921 B1 * | 11/2002 | Mansoorian et al. | ........ | 710/305 |
| 6,898,201 B1 | 5/2005 | James et al. | | |
| 7,146,051 B2 * | 12/2006 | Kang et al. | .................. | 382/232 |
| 7,149,932 B2 * | 12/2006 | Ono | ............................ | 714/43 |
| 7,174,484 B2 * | 2/2007 | Shimono et al. | ............ | 714/700 |
| 2007/0002893 A1 * | 1/2007 | Neff et al. | .................... | 370/465 |
| 2008/0024347 A1 * | 1/2008 | Choe | .......................... | 341/155 |

OTHER PUBLICATIONS

Serial Interface for Data Converters, Application Overview Version 9.0 May 3, 2005, Edited by Nokia et al, JEDEC Committee: JC-16.1 Committee Item No. 132.
Serial Interface for Data Converters, Electrical Specification, Version 9.0 May 4, 2005, Editor Shergill, JEDEC Committee: JC-16.1 Committee Item No. 132.
Serial Interface for Data Converters, Data Stream, Version 0.5 May 4, 2005, Edited by Moeschen et al, JEDEC Committee: JC16.1 Committee Item No. 132.

* cited by examiner

*Primary Examiner*—Peguy JeanPierre
(74) *Attorney, Agent, or Firm*—Indiorio Teska & Coleman

(57) ABSTRACT

A high speed transmission system includes at least one transmitter; a buffer circuit for assembling into a data packet in parallel a number of sample conversion words from said transmitter; a marker circuit for adding a marker word to said data packet for framing said data packet; and a serializer circuit for serializing said data packet either before or after said marker word is added, with an embedded clock for transmission.

23 Claims, 4 Drawing Sheets

HIGH SPEED TRANSMISSION SYSTEM

RELATED APPLICATIONS

This application claims benefit of U.S. Provisional Application Ser. No. 60/717,312 filed Sep. 15, 2005 incorporated by reference herein.

FIELD OF THE INVENTION

This invention relates to a high speed, transmission system and more particularly, in one implementation to a high speed analog to digital converter (ADC) system.

BACKGROUND OF THE INVENTION

Digital data transmission can be done either in parallel mode, serial mode, or a combination of the two. Parallel mode is the simplest to implement but it demands the most interconnect lines, which requires more space and complex routing, and often more power. Serial transmission requires only a single data line which implies less space and simplified routing, and it usually comes with a power savings. However, serial data transmission does require more speed per data line and can be much more complex to implement than parallel transmission. Analog to digital converters (ADCs) traditionally provide high speed parallel output to a receiver, embodied in e.g., FPGA, or ASIC. An N bit ADC has N lines or pins (2 N pins for a differential system) connecting it to the FPGA. For M converters there will be M×N (or M×2 N) pins. The greater the number, M, of ADCs and the greater the ADC resolution, N, the greater the number of pins. Higher output pin numbers makes routing to the receiver more complex. Power requirements can be high due to the number of output drivers necessary to drive the parallel output pins. One (or two) more pin(s) is required for the output data clock. In the parallel arrangement a twelve bit (N=12) ADC can reach sampling rates of several hundred Mbps corresponding to like bit rates at the FPGA. In another approach serial output is employed. There, instead of each bit of resolution of the ADC having its own output pin, all of the output bits of the ADC are streamed over a serial line or channel. This requires a much higher data rate. For example, an N bit ADC would parallel transfer all N bits in a single unit of time, while in a serial transfer all bits would have to be transferred in the single unit of time so each bit would have only 1/N th of the transfer time. Typically, in this approach, a number of ADCs 4, 8, 128 or more each have their own serial channel. Here another clock pin is needed to provide a frame clock in addition to the output data clock. The frame clock is used to distinguish each sample serially transferred. Here, too, the data channels can be skewed relative to each other and with respect to the output data clock. And it is cumbersome to make the clock edges adjustable so they can be properly aligned in unambiguous regions of the data in all channels. Here a sampling rate at 65 Mbps with 12 bit (N=12) ADCs results in a data rate at the FPGA of 780 Mbps. A specification of the JEDEC Solid State Technology Association for a Data Converter Serial Interface (JESD204) serializes each analog to digital conversion or sample and eliminates the clock pin or pins by using the embedded clock in the serialized data. But this approach also requires a feedback loop from receiver to transmitter to confirm a handshake protocol and then release the data for transmission. This approach uses an 8B/10B encoding scheme where every eight bits are accompanied by two more bits which are used for maintaining electrical balance and for error checking. This results in a maximum ideal efficiency of only 80%. Further, the error checking is not sufficiently robust to correct the errors and does not detect the errors in real time.

BRIEF SUMMARY OF THE INVENTION

It is therefore an object of this invention to provide an improved high speed transmission system.

It is a further object of this invention to provide an improved high speed ADC system.

It is a further object of this invention to provide the improved high speed transmission system which uses an embedded clock and needs no separate high speed clock pin (or clock pins in the case of differential implementations).

It is a further object of this invention to provide the improved high speed transmission system which avoids skewing problems between clock and data occurring in traditional serial ADC systems.

It is a further object of this invention to provide the improved high speed transmission system which obviates the need to adjust the clock to the data.

It is a further object of this invention to provide the improved high speed transmission system which enables use of more robust, real time error detecting and error correcting.

It is a further object of this invention to provide the improved high speed transmission system which provides flexibility to trade off marker size including header and/or error bits to obtain efficiency of over 87%.

The invention results from the realization that an improved, more efficient, high speed transmission system which eliminates the need for additional clocks and clock pins, avoids skewing problems between clock and data signals and makes use of more robust, real time, error checking/correcting can be effected by assembling a number of sample conversion words into a data packet with a marker word which can be a header or error word or both and by serializing the data packet with an embedded clock for transmission.

The subject invention, however, in other embodiments, need not achieve all these objectives and the claims hereof should not be limited to structures or methods capable of achieving these objectives.

This invention features a high speed serial ADC system including at least one ADC and a buffer circuit for assembling into a data packet in parallel a number of sample conversion words from the ADC. There is a marker circuit for adding a marker word to the data packet for framing the data packet and a serializer circuit for serializing the data packet either before or after the marker word is added, with an embedded clock for transmission.

In a preferred embodiment the marker circuit may include a header circuit for adding a header word to frame the data packet. The marker circuit may include an error checking circuit for adding an error checking word which frames the data packet. The error checking circuit may be a real time error checking circuit; it may be an error checking and correction circuit. There may be a scrambler circuit for maintaining a minimum required transition density and electrical balance in data packet transmission. The ADC may be a twelve bit ADC with each data packet including sixty-four bits with eight header bits, forty-eight data bits in four twelve bit words and eight error bits. The ADC may be a ten bit ADC with each data packet including sixty four bits, with eight header bits, forty eight data bits in four twelve bit words and eight error bits with each ten bit sample conversion including two dummy bits. The ADC may be a fourteen bit ADC with each data packet including sixty four bits with one header bit, fifty six data bits in four sample conversion words and seven error bits. Or there may be zero header bits with fifty six data bits in four sample conversion words and eight error bits. The ADC may be a sixteen bit ADC with each data packet including sixty bits with four header bits, forty eight data bits in three sample conversion words and eight error bits.

This invention more generally features a high speed transmission system including at least one transmitter, a buffer circuit for assembling into a data packet in parallel a number of sample conversion words from said transmitter, a marker circuit for adding a marker word to said data packet for framing said data packet, and a serializer circuit for serializing said data packet either before or after said marker word is added, with an embedded clock for transmission.

In a preferred embodiment the marker circuit may include a header circuit for adding a header word to frame the data packet. The marker circuit may include an error checking circuit for adding an error checking word which frames the data packet. The error checking circuit may be a real time error checking circuit. The error checking circuit may be an error checking and correction circuit. There may be a scrambler circuit for maintaining a minimum required transition density and electrical balance in data packet transmission. The transmitter may include an ADC. The ADC may be a twelve bit ADC, each data packet including sixty four bits, with eight header bits, forty eight data bits in four twelve bit words and eight error bits. The ADC may be a ten bit ADC, each data packet including sixty four bits, with eight header bits, forty eight data bits in four twelve bit words and eight error bits with each ten bit sample conversion including two dummy bits. The ADC may be a fourteen bit ADC, each data packet including sixty four bits, with one header bit, fifty six data bits in four sample conversion words and seven error bits. The ADC may be a fourteen bit ADC, each data packet including sixty four bits, with zero header bits, fifty six data bits in four sample conversion words and eight error bits. The ADC may be a sixteen bit ADC, each data packet including sixty bits, with four header bits, forty eight data bits in three sample conversion words and eight error bits.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1A:
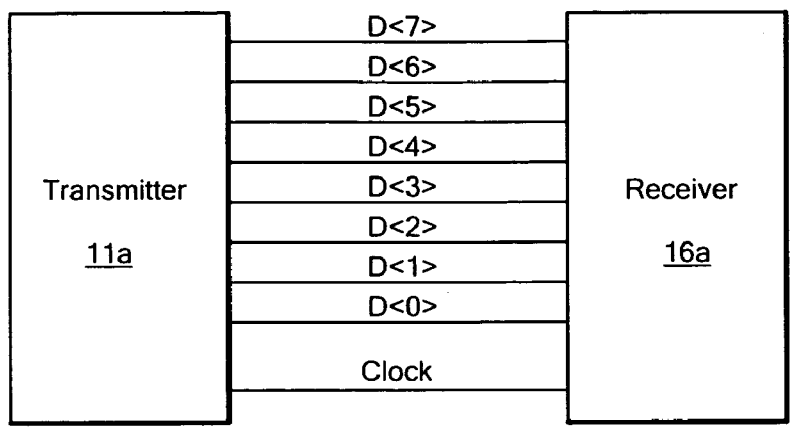
FIG. 1A is a schematic block diagram of a full parallel transmission system.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1B:
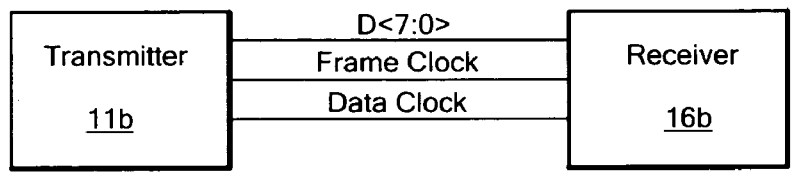
FIG. 1B is a schematic block diagram of a full serial transmission system.

FIG. 1A shows a full parallel 8-bit digital data transmission system $10a$ between a transmitter $11a$ and receiver $16a$. Note that eight data lines and a clock are required to move the data from the transmitter $11a$ to the receiver $16a$. FIG. 1B on the other hand shows an 8-bit digital data transmission system $10b$ implemented in a full serial mode. In this case only a single data line is required in addition to two clock lines. All 8 bits of data are transmitted serially on the data line in a single frame clock period. The data clock is a high speed clock used to receive the data.

Figure 1C:
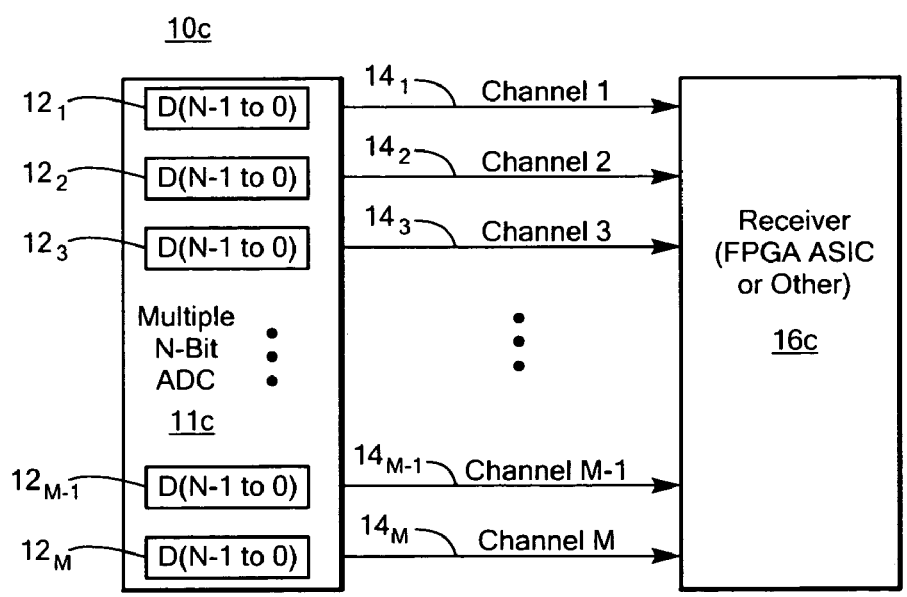
FIG. 1C is a simplified schematic block diagram of a high speed serial ADC system according to this invention.

There is shown in FIG. 1C a high speed serial ADC system $10c$ according to this invention having a transmitter $11c$ including at least one N bit analog to digital converter. In this example there are M analog to digital converters, ADCs $12_1$, $12_2$, $12_3$, $12_{M-1}$, $12_M$, each of which transmits over a serial channel $14_1$, $14_2$, $14_3$, $14_{M-1}$, $14_M$ to receiver $16c$ which may be embodied in an FPGA, ASIC or other device.

Figure 2:
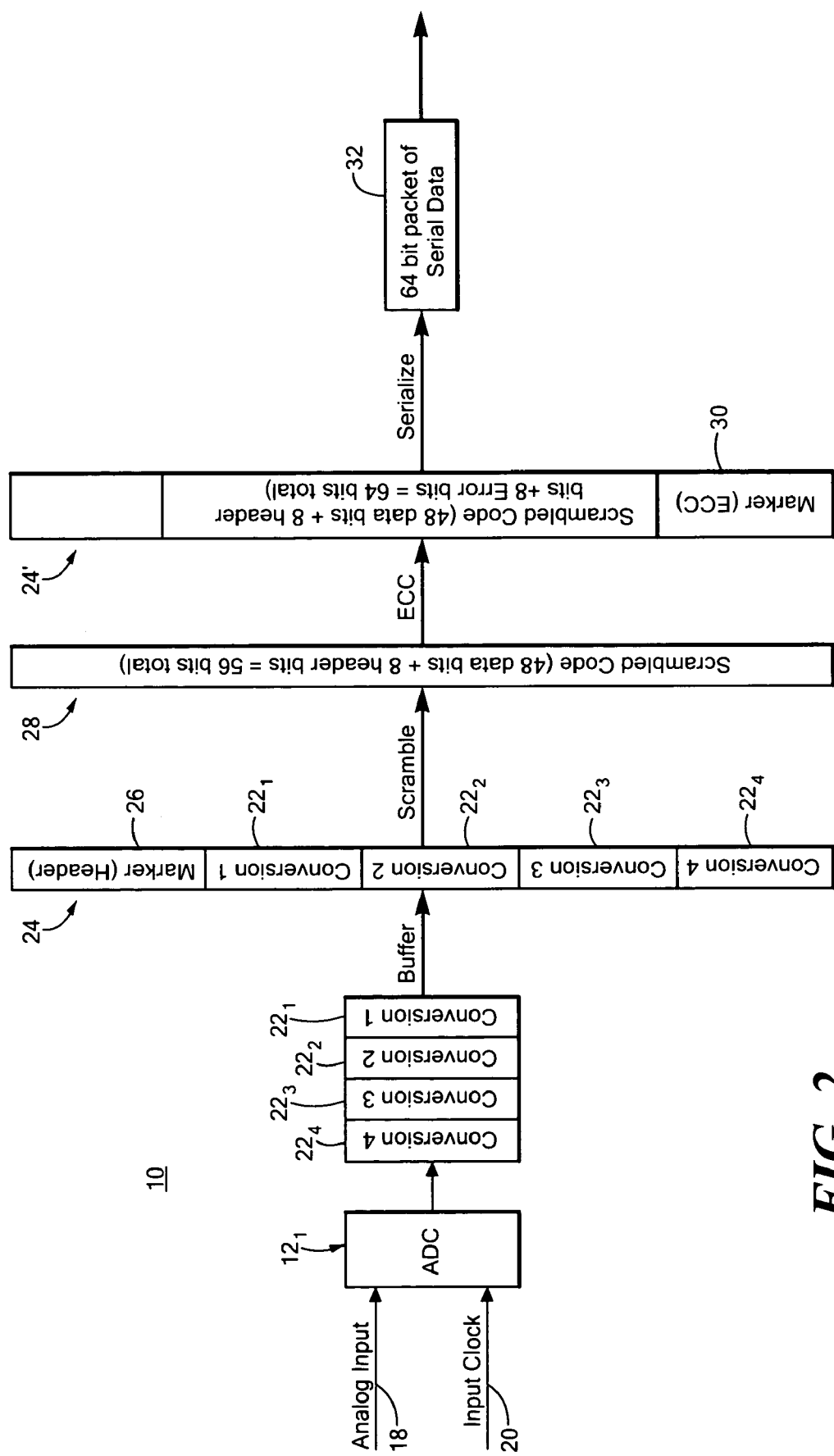
FIG. 2 is a data flow diagram for the system of FIG. 1C.

In operation, as shown in the data flow diagram of FIG. 2, ADC $12_1$ receives an analog input at $18$ and an input clock $20$. Each time it samples analog input $18$ in response to input clock signal $20$ it provides a sample conversion word $22_1$, $22_2$, $22_3$, $22_4$. Sample conversion words are delivered to a buffer circuit and assembled into a data packet $24$ along with a marker word $26$. Data packet $24$ may, but need not necessarily, be scrambled resulting in a scramble code $28$ for the purpose of maintaining an electrical balance in the transmission by attempting to balance the numbers of ones and zeros in data packet $24$. Scrambling is but one way of maintaining this balance. In some cases this balance is not important, in which case this step could be omitted. The scrambler is a well known device which encodes the data so that there are approximately the same number of ones and zeros in the scrambled data. Generally scramblers X-OR the input data with the output of a pseudo-random bit stream generator which allows for the same operation to perform the descrambler function in a receiver. The standard SONET scrambler makes use of a seven bit PRBS which hits 127 different states before it recycles. In the instant case the data to be scrambled will only be the marker word plus the converter data bits; this will be less than 60 bits which means a six bit scrambler would be sufficient which hits sixty three states before recycling. These scramblers may be implemented in a parallel fashion rather than serial. Additionally, other non-PRBS scramblers could be used. Data packet $24$ as shown includes fifty six bits including an eight bit marker word shown as header $26$ and four twelve bit sample conversion words $22_1$-$22_4$. The marker may be any form or device which enables the data packet to be framed so that the receiver can identify the data packet and its sample conversion words. After scrambling, if this done, data packet $24$ may be subjected to error checking and correction. This may add on an additional eight error bits for a total of sixty four bits so that data packet $24'$ now consists of sixty four bits total. Word $30$ consisting of eight error checking and correction bits may act as the marker word as well for purposes of recognizing the data packet and its sample conversion words. Either one of the markers, including the header, or the error checking portion may be increased or decreased in the number of bits depending upon their need. For example, if the transmission distance from the ADC system $10$ and receiver $16$ is short the marker error checking and correction word $30$ could be drastically reduced and the unused bits could be added to the marker header word $26$ and used for other purposes. Finally the scrambled data packet 24' with, in this particular example the marker error checking and correction code 30, is serialized and output as a sixty four bit packet of serial data as shown 32. In another example, the data could be serialized, the marker then added, and error checking and scrambling occurring thereafter.

Figure 3:
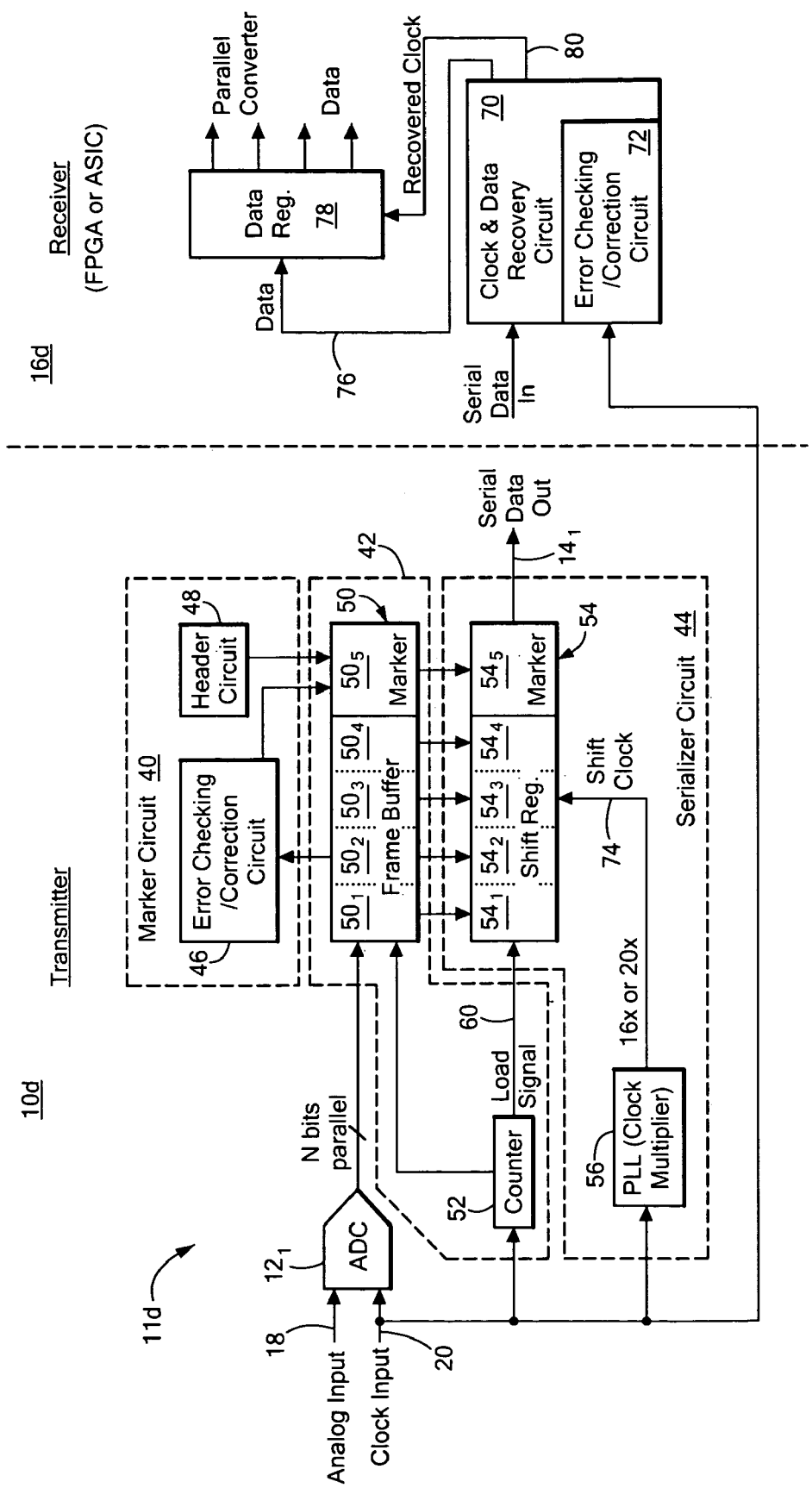
FIG. 3 is a more detailed schematic diagram of the high speed serial ADC system of FIG. 1C.

In one embodiment, FIG. 3, high speed serial ADC system 10d includes a plurality of ADCs $12_1$-$12_N$ only one of which $12_1$ is shown in FIG. 3. Along with ADC $12_1$ is a marker circuit 40, buffer circuit 42, and serializer circuit 44. Marker circuit 40 may include error detection/correction circuit 46 and/or header circuit 48. Buffer circuit 42 includes frame buffer 50 and counter 52. Serializer circuit 44 includes shift register 54 and phase lock loop 56 which acts as a clock multiplier. Error checking circuit 46 may be a real time error checking circuit and if sufficient bits are provided a robust error correction circuit as well. It could be implemented using a cyclical redundancy code checker or hamming code, for example. Each of frame buffer circuit 50 and shift register 54 may include four sections $50_1$, $50_2$, $50_3$, $50_4$, and $54_1$, $54_2$, $54_3$, $54_4$, respectively, to accommodate four sample conversion words from ADC $12_1$. There is also an additional section, $50_5$, $54_5$ in each case to accommodate a marker word which may include a header word, an error word or both. For simplicity sake the scrambler has been omitted in FIG. 3.

In operation the analog input signal arrives at input 18 to ADC $12_1$ which also receives the input clock at 20. At each clock time ADC $12_1$ puts out an N bit sample conversion word from the analog input 18. Counter 52 counts the clock input cycles and, in this particular example, when four have been counted and frame buffer is full a load signal is sent on line 60 to shift register 54 to load the four sample conversion words from frame buffer 50 into shift register 54. At this time the marker word is present in section $50_5$ of frame buffer 50 and is transferred to section $54_5$ of shift register 54. Phase lock loop 56 acts as a clock multiplier and multiplies the input clock on line 20 to ADC $12_1$ by a factor of, for example, 16× or 20× which it then applies to shift register 54 to serially shift out the data packet therein over a serial channel $14_1$ to receiver 16d. Receiver 16d typically is implemented with an FPGA or ASIC having a conventional clock and data recovery circuit 70 with an error checking and correction circuit 72. Clock and data recovery circuit 70 recovers the clock signal which was embedded in the data packet by the action of phase lock loop 56 providing its shift clock signal on line 74 to shift register 54. The incoming data after having been checked and/or corrected for errors is delivered on line 76 to data register 78 from which it is output in parallel form. The recovered clock signal on line 80 is used to clock the serial data on line 76 into the parallel data register 78.

Figure 4:
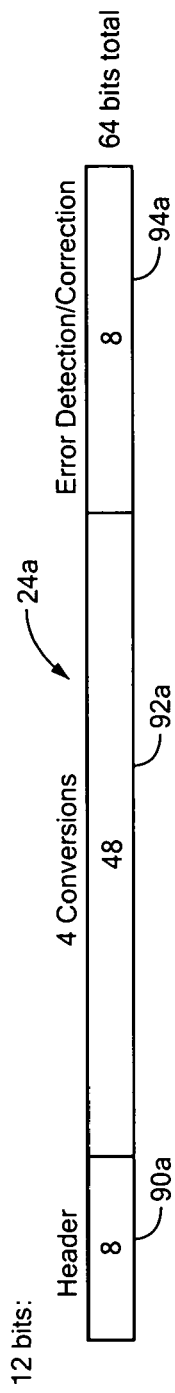
FIGS. 4-8 are illustrations of a few data packet formats according to this invention.

The data packet, sample conversion word and the marker words including header words and/or error words may have various forms and sizes examples of which are as shown in FIGS. 4-8. In FIG. 4 the analog to digital converter is a twelve bit converter. Data packet 24a is sixty four bits including eight header bits 90a, forty eight data bits 92a in four sample conversion words and an error word 94a of eight bits.

Figure 5:
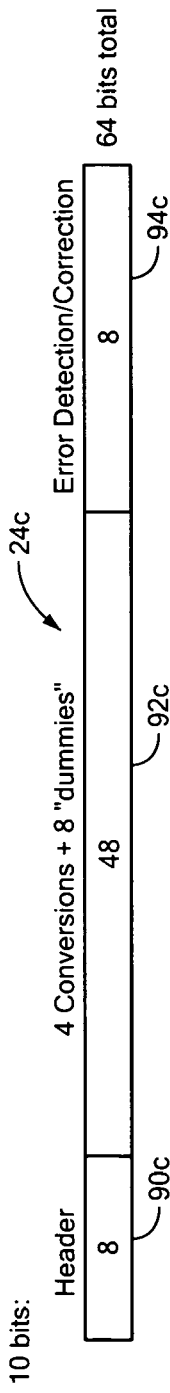

In FIG. 5 a ten bit ADC (N equals 10) has a sixty four bit data packet 24c with a header word 90c of eight bits, forty eight data bits 92c forming four sample conversion words with two dummy bits in each sample conversion word for a total of eight dummies, and error word 94c of eight bits.

Figure 6:
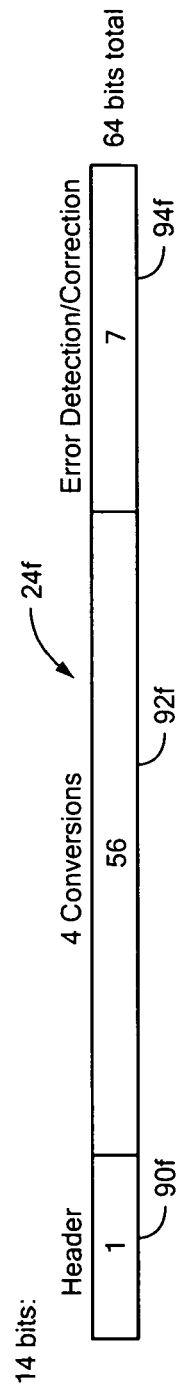
Figure 7:
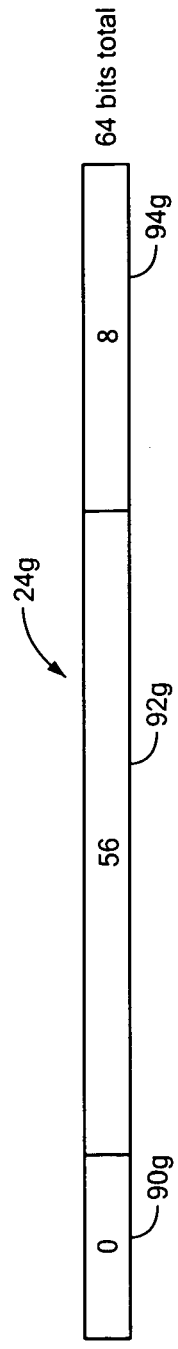
Figure 8:
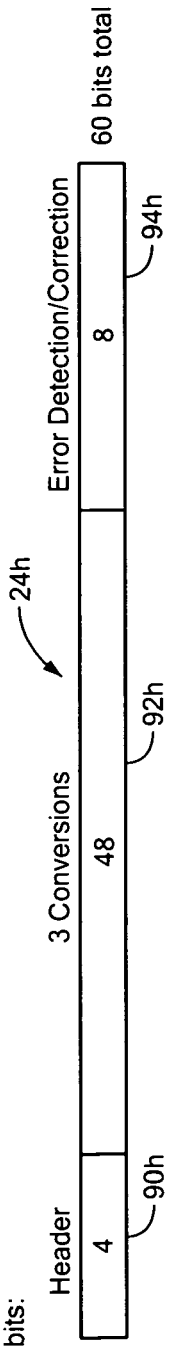

In a fourteen bit ADC where N equals 14, data packet 24f, FIG. 6, header word 90f of one bit, fifty six data bits 92f, forming four sample conversion words and an error word 94f of seven bits. Or as shown in FIG. 7, still using a fourteen bit ADC, data packet 24g may have a header word 90g of zero bits, fifty six data bits 92g, forming four sample conversion words and an eight bit error word 94g. All of these data packets shown in FIGS. 4-7, data packets 24a-g, have sixty four bits each total; but this too is not a necessary limitation. For example, as shown in FIG. 8 a sixteen bit ADC, (N equals 16) has a data packet 24h, with a header word 90h of four bits, forty eight data bits 92h forming three sample conversion words and an error word 94h of eight bits for a total of only sixty bits in the entire data packet.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. The subject invention for example, does not necessarily require the handshake mechanism disclosed in the JEDEC Standard but that handshake mechanism could be implemented in the subject system.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A high speed serial ADC system comprising:
   at least one ADC;
   a buffer circuit for assembling into a data packet in parallel a number of sample conversion words from said ADC;
   a marker circuit for adding a marker word to said data packet for framing said data packet; and
   a serializer circuit for serializing said data packet either before or after said marker word is added, with an embedded clock for transmission.

2. The high speed serial ADC system of claim 1 in which said marker circuit includes a header circuit for adding a header word to frame said data packet.

3. The high speed serial ADC system of claim 1 in which said marker circuit includes an error checking circuit for adding an error checking word which frames said data packet.

4. The high speed serial ADC system of claim 3 in which said error checking circuit is a real time error checking circuit.

5. The high speed serial ADC system of claim 3 in which said error checking circuit is an error checking and correction circuit.

6. The high speed serial ADC system of claim 1 further including a scrambler circuit for maintaining a minimum required transition density and electrical balance in data packet transmission.

7. The high speed serial ADC system of claim 1 in which said ADC is a twelve bit ADC, each data packet includes sixty four bits, including eight header bits, forty eight data bits in four twelve bit words and eight error bits.

8. The high speed serial ADC system of claim 1 in which said ADC is a ten bit ADC, each data packet includes sixty four bits, including eight header bits, forty eight data bits in four twelve bit words and eight error bits with each ten bit sample conversion including two dummy bits.

9. The high speed serial ADC system of claim 1 in which said ADC is a fourteen bit ADC, each data packet includes sixty four bits, including one header bit, fifty six data bits in four sample conversion words and seven error bits.

10. The high speed serial ADC system of claim 1 in which said ADC is a fourteen bit ADC, each data packet includes sixty four bits, including zero header bits, fifty six data bits in four sample conversion words and eight error bits.

11. The high speed serial ADC system of claim 1 in which said ADC is a sixteen bit ADC, each data packet includes sixty bits, including four header bits, forty eight data bits in three sample conversion words and eight error bits.

12. A high speed transmission system comprising:
   at least one transmitter;
   a buffer circuit for assembling into a data packet in parallel a number of sample conversion words from said transmitter;
   a marker circuit for adding a marker word to said data packet for framing said data packet; and
   a serializer circuit for serializing said data packet either before or after said marker word is added, with an embedded clock for transmission.

13. The high speed transmission system of claim 12 in which said marker circuit includes a header circuit for adding a header word to frame said data packet.

14. The high speed transmission system of claim 12 in which said marker circuit includes an error checking circuit for adding an error checking word which frames said data packet.

15. The high speed transmission system of claim 14 in which said error checking circuit is a real time error checking circuit.

16. The high speed transmission system of claim 14 in which said error checking circuit is an error checking and correction circuit.

17. The high speed transmission system of claim 12 further including a scrambler circuit for maintaining a minimum required transition density and electrical balance in data packet transmission.

18. The high speed transmission system of claim 12 in which said transmitter includes an ADC.

19. The high speed transmission system of claim 18 in which said ADC is a twelve bit ADC, each data packet includes sixty four bits, including eight header bits, forty eight data bits in four twelve bit words and eight error bits.

20. The high speed transmission system of claim 18 in which said ADC is a ten bit ADC, each data packet includes sixty four bits, including eight header bits, forty eight data bits in four twelve bit words and eight error bits with each ten bit sample conversion including two dummy bits.

21. The high speed transmission system of claim 18 in which said ADC is a fourteen bit ADC, each data packet includes sixty four bits, including one header bit, fifty six data bits in four sample conversion words and seven error bits.

22. The high speed transmission system of claim 18 in which said ADC is a fourteen bit ADC, each data packet includes sixty four bits, including zero header bits, fifty six data bits in four sample conversion words and eight error bits.

23. The high speed transmission system of claim 18 in which said ADC is a sixteen bit ADC, each data packet includes sixty bits, including four header bits, forty eight data bits in three sample conversion words and eight error bits.

* * * * *